(12) United States Patent
Kim et al.

(10) Patent No.: US 10,578,911 B2
(45) Date of Patent: Mar. 3, 2020

(54) DISPLAY DEVICE

(71) Applicant: Samsung Display Co., Ltd., Yongin-si (KR)

(72) Inventors: Yeun Tae Kim, Hwaseong-si (KR); Min Wook Park, Asan-si (KR); Sang Il Park, Seoul (KR); Ji Won Sohn, Seoul (KR); Jun Bo Sim, Asan-si (KR)

(73) Assignee: Samsung Display Co., Ltd., Youngin-si (KR)

( * ) Notice: Subject to any disclaimer, the term of this patent is extended or adjusted under 35 U.S.C. 154(b) by 8 days.

(21) Appl. No.: 15/952,120

(22) Filed: Apr. 12, 2018

(65) Prior Publication Data
US 2019/0086719 A1 Mar. 21, 2019

(30) Foreign Application Priority Data
Sep. 15, 2017 (KR) .................. 10-2017-0118603

(51) Int. Cl.
*G02F 1/1335* (2006.01)
*G02F 1/1339* (2006.01)
(Continued)

(52) U.S. Cl.
CPC ...... *G02F 1/133514* (2013.01); *G02F 1/1339* (2013.01); *G02F 1/133345* (2013.01);
(Continued)

(58) Field of Classification Search
CPC ......... G02F 1/133514; G02F 1/133512; G02F 1/1339; G02F 1/133345; G02F 1/136286; G02F 2201/121; G02F 2201/123; G02F 1/133516; G02F 1/133509; G02F 1/133371; G02F 1/1343; G02F 1/13392; G02F 1/13394; G02F 1/133608; G02F 1/133611; G02F 1/136209; G02F 2001/13396; H01L 27/124; G09G 2300/023; G09G 2320/0242; G09G 2300/0452; G09G 2300/0443; G09G 5/05; G09G 5/026; G09G 3/3607
See application file for complete search history.

(56) References Cited

U.S. PATENT DOCUMENTS 8,810,755 B2 8/2014 Joo et al.
9,207,375 B2 12/2015 Joo et al.
(Continued)

FOREIGN PATENT DOCUMENTS

JP 2007025066 A * 2/2007 ............ A61M 1/287

*Primary Examiner* — Julie Anne Watko
(74) *Attorney, Agent, or Firm* — H.C. Park & Associates, PLC

(57) ABSTRACT

A display device includes a first substrate, thin film transistors, a color filter layer, a light blocking pattern, a second substrate, pixel electrodes, and, a plurality of first spacers. The first substrate includes a display area having a plurality of pixel areas and a non-display area surrounding at least part of the display area, the display area including an interior area and at least one peripheral area disposed exteriorly of the interior area. The second substrate defines with the first substrate a space to contain light transmittance material. The plurality of first spacers is disposed in the light transmittance space between the first and second substrates and only in the interior area of the display area.

18 Claims, 10 Drawing Sheets

(51) Int. Cl.
*G02F 1/1333* (2006.01)
*G02F 1/1362* (2006.01)
*H01L 27/12* (2006.01)

(52) U.S. Cl.
CPC .. *G02F 1/133512* (2013.01); *G02F 1/133608* (2013.01); *G02F 1/133611* (2013.01); *G02F 1/136209* (2013.01); *G02F 1/136286* (2013.01); *G02F 2001/13396* (2013.01); *G02F 2201/121* (2013.01); *G02F 2201/123* (2013.01); *H01L 27/124* (2013.01)

(56) References Cited

U.S. PATENT DOCUMENTS

| | | | |
|---|---|---|---|
| 2005/0151909 A1* | 7/2005 | Yagi | G02F 1/133514 349/138 |
| 2011/0007251 A1* | 1/2011 | Yamamoto | G02F 1/133514 349/108 |

* cited by examiner

DISPLAY DEVICE

CROSS REFERENCE TO RELATED APPLICATION

This application claims priority from and the benefit of Korean Patent Application No. 10-2017-0118603, filed on Sep. 15, 2017, which is hereby incorporated by reference for all purposes as if fully set forth herein.

BACKGROUND

Field

Exemplary implementations of the invention relate generally to a display device, and more particularly, to a display device having improved display quality.

Discussion of the Background

Among display devices, a liquid crystal display device is one of the most widely used flat panel display devices. The liquid crystal display device adjusts the amount of transmitted light by applying voltages to electrodes, such as a pixel electrode and a common electrode, disposed on opposing two substrates to control the alignment of liquid crystal molecules in a liquid crystal layer interposed the two substrates.

Since the liquid crystal display device is a non-luminous device and the liquid crystal panel including the substrates does not emit light by itself, a backlight unit for supplying light to the liquid crystal panel is required.

The liquid crystal panel is configured such that a cell gap filled with liquid crystals is maintained by a column spacer disposed between the two substrates. The column spacer may be formed by applying a spacer material onto one of the two substrates and patterning the applied spacer material.

However, before the column spacer is formed, a difference in thickness between the display area and non-display area of the liquid crystal panel may occur in the lower film disposed on the substrate. In this case, when forming the column spacers, a difference in height may occur between a column spacer located in the edge area of the display area adjacent to the non-display area and a column spacer located in the inner area of the display area.

Such a difference in height between the column spacers can make the cell gap non-uniform between two substrates in the edge area and inner area of the display area. Accordingly, the amount of liquid crystals filled in the edge area of the display area may be different from that of the inner area of the display area, and thus an edge stain phenomenon in which the edge area of the display area is seen relatively bright may occur.

The above information disclosed in this Background section is only for understanding of the background of the inventive concepts, and, therefore, it may contain information that does not constitute prior art.

SUMMARY

Display devices constructed according to exemplary implementations of the invention are capable of improving display quality by reducing or preventing stain phenomenon at parts of a display area.

Additional features of the inventive concepts will be set forth in the description which follows, and in part will be apparent from the description, or may be learned by practice of the inventive concepts.

It is to be understood that both the foregoing general description and the following detailed description are exemplary and explanatory and are intended to provide further explanation of the invention as claimed.

According to one or more implementations of the invention, a display device includes: a first substrate including a display area having a plurality of pixel areas and a non-display area surrounding at least part of the display area, the display area including an interior area and at least one peripheral area disposed exteriorly of the interior area; thin film transistors disposed in the pixel areas of the first substrate; a color filter layer including color filters disposed in the pixel areas on the thin film transistors; a light blocking pattern disposed in a boundary between the pixel areas and the non-display area, the light blocking pattern having a stacked structure including at least two of the color filters; a second substrate defining with the first substrate a space to contain light transmittance material; pixel electrodes disposed in the pixel areas and electrically connected with the thin film transistors; and a plurality of first spacers disposed in the light transmittance space between the first and second substrates and only in the interior area of the display area.

The edge area may be disposed along a boundary of the display area and the non-display area, and may have a width of about 0.1 mm to about 3 mm.

At least some of the first spacers may overlap the thin film transistors, and the plurality of first spacers maintains substantially uniform spacing between the first and second substrates across the interior area.

The light blocking pattern disposed in the edge area may have a thickness that increases from the display area to the non-display area.

The display device may further include a plurality of second spacers disposed in the edge area and the interior area and having a height less than the height of the first spacers. At least some of the plurality of second spacers may overlap the thin film transistors.

The first spacers may include main column spacers and the second spacers may include sub column spacers, the first main column spacers may have a height that differs from the height of the sub column spacers by 0.3 μm or more, and the plurality of sub column spacers may be arranged at a density equal to or lower than that of the plurality of main column spacers At least one of the second spacers disposed in the edge area may have a shape extending to the non-display area.

An uppermost surface of one of the second spacers disposed in the edge area may be disposed in a position higher than an uppermost surface of another one of the second spacers disposed in the inner area, and lower than uppermost surfaces of the first spacers.

The at least some of the second spacers may be disposed to overlap two adjacent thin film transistors.

At least one of the second spacers disposed in outermost pixel areas located in the edge area may be adjacent to wirings disposed in the non-display area.

The display device may further include a protective layer disposed on the color filter layer and the light blocking pattern. The first spacers may be disposed on the protective layer, and the stacked structure of the color filters may include a red color filter and a blue color filter.

According to another exemplary implementation of the invention, a display device includes: a first substrate including a display area having a plurality of pixel areas and a non-display area at least partially surrounding the display area; thin film transistors disposed in the pixel areas of the first substrate; a color filter layer including color filters disposed in the pixel areas on the thin film transistors; a light blocking pattern disposed in a boundary of the pixel areas and the non-display area and having a stacked structure of at least two of the color filters; pixel electrodes disposed in the pixel areas and electrically connected with the thin film transistors; and a plurality of first spacers disposed in an edge area of the display area adjacent to the non-display area and in an inner area of the display area. An uppermost surface of one of the first spacers disposed in the edge area and an uppermost surface of another of the first spacers disposed in the inner area are located in substantially the same plane.

The edge area may be disposed along a boundary of the display area and the non-display area, and may have a width of about 0.1 mm to about 3 mm.

The light blocking pattern disposed in the edge area may have a thickness of that increases from the display area to the non-display area.

The display device may further include a protective layer disposed on the color filter layer and the light blocking pattern. The first spacers may be disposed on the protective layer, and the stacked structure of color filters may include a stacked structure of a red color filter and a blue color filter.

One of the blue color filter and the red filter may have a groove disposed in an area overlapping the first spacer disposed in the edge area.

At least some of the plurality of first spacers may overlap the thin film transistors.

The display device may further include a plurality of second spacers disposed in the edge area and the inner area and having a thickness less than the first spacers. At least some of the plurality of second spacers may overlap the thin film transistors.

The first spacers may include main column spacers and the second spacers may include sub column spacers A difference between the height of the main column spacers and the height of the sub column spacers may be about 0.3 µm or more.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
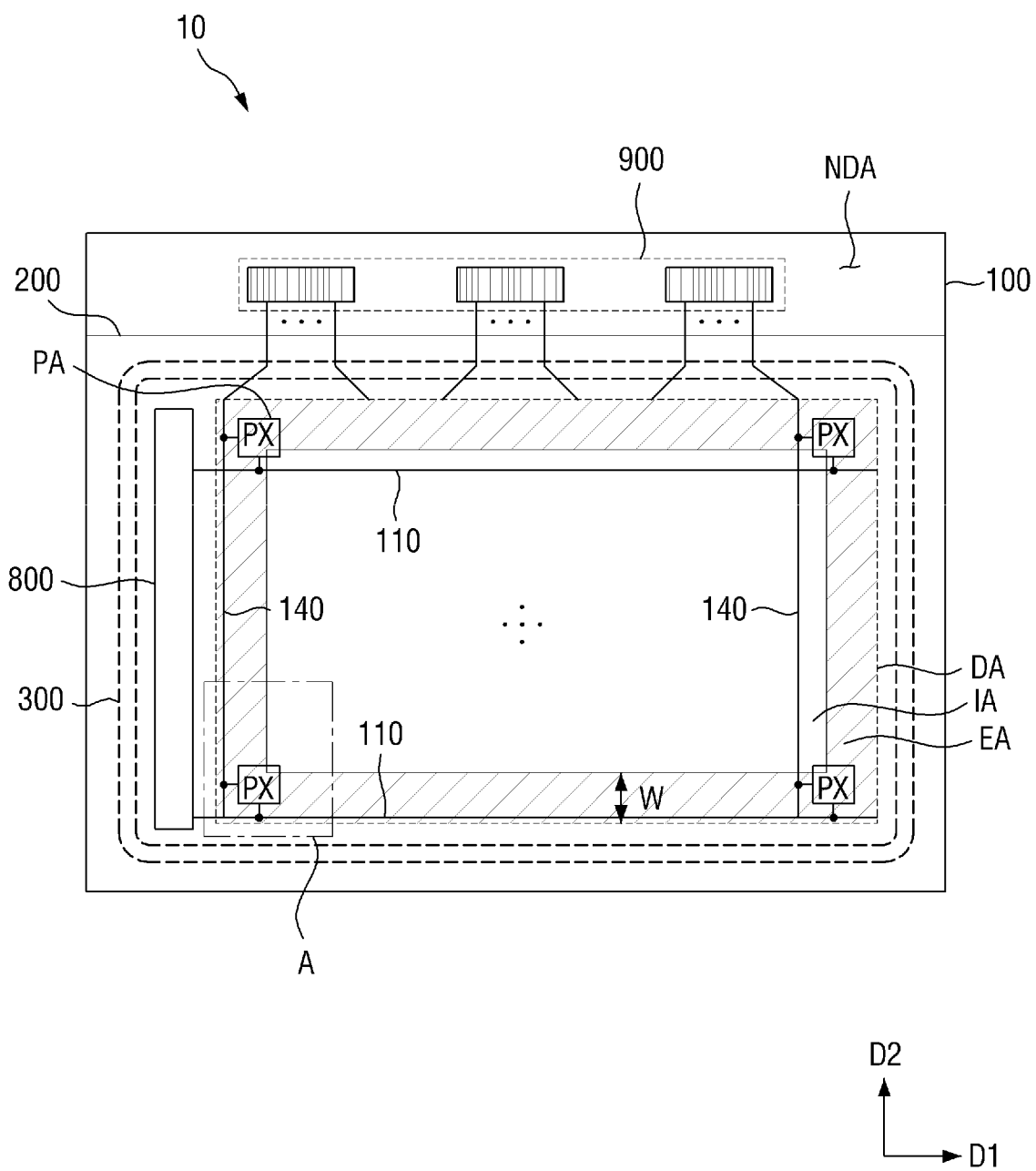
FIG. 1 is a plan view of an exemplary embodiment of a display device constructed according to the principles of the invention.

In the following description, for the purposes of explanation, numerous specific details are set forth in order to provide a thorough understanding of various exemplary embodiments or implementations of implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a plan view of an exemplary embodiment of a display device constructed according to the principles of the invention.

Referring to FIG. 1, a display device 10 may include a first display panel 100 and a second display panel 200. Hereinafter, the display device 10 will be described as a liquid crystal display device as an example, but the principles of the invention are applicable to other types of display devices, as will be apparent to the skilled artisan.

The first display panel 100 may include a display area DA and a non-display area NDA surrounding the display area DA. The display area DA is an area displaying an image, and the non-display area NDA is an area not displaying an image. The display area DA may include an edge area EA adjacent to the non-display area NDA and an inner area IA other than the edge area EA. The edge area EA may at least partially surround the inner area IA and may be disposed along a boundary between the display area DA and the non-display area NDA.

The second display panel 200 faces the first display panel 100, and includes a display area DA and a non-display area NDA like the first display panel 100.

The first display panel 100 and the second display panel 200 face each other, and may be attached together through a sealing member 300 to form a space, such as a cell gap, containing light transmittance material, such as liquid crystals. For example, a liquid crystal layer (400 of FIG. 3) may be disposed between the first display panel 100 and the second display panel 200, which are attached together by the sealing member 300.

The first display panel 100 may be a panel including switching elements for driving the liquid crystal molecules in the liquid crystal layer (400 of FIG. 3), for example, thin film transistors, and a pixel electrode.

A gate wiring 110, a data wiring 140, and a pixel element PX connected to the gate wiring 110 and the data wiring 140 are disposed in the display area DA of the first display panel 100.

A gate driving unit 800, a data driving unit 900, and the sealing member 300 may be disposed in the non-display area NDA of the first display panel 100.

The gate driving unit 800 provides a gate signal to the gate wiring 110. In some exemplary embodiments, the gate driving unit 800 may be implemented by an amorphous silicon gate (ASG) integrally formed in the non-display area NDA, but the exemplary embodiments of the gate driving unit 800 are not limited thereto. When the gate driver 800 is implemented by ASG, a plurality of wirings (115 and 145 in FIG. 6) are patterned and arranged in an area where the gate driving unit 800 is formed.

The data driving unit 900 provides a data voltage to the data wiring 140. In some exemplary embodiments, the data driving unit 900 may have a COG (chip on glass) structure.

In other some exemplary embodiments, the data driving unit 900 may have a TCP (tape carrier package) structure or a COF (chip on film) structure.

Each gate wiring 110 extends along a first direction D1, and the plurality of gate wirings 110 arranged in a second direction D2 intersect the first direction D1. The gate wiring 110 is connected to the gate driving unit 800 disposed in the non-display area NDA, and receives a gate signal from the gate driving unit 800.

Each data wiring 140 extends along the second direction D2, and the plurality of data wirings arranged in the first direction D1. The data wiring 140 is insulated from the gate wiring 110. The data wiring 140 is connected to the data driving unit 900 disposed in the non-display area NDA, and receives a data voltage from the data driving unit 900.

A plurality of pixel areas PA are disposed in the display area DA, and each of the pixel areas PA may be any one of a red pixel area R emitting red light, a green pixel area G emitting green light, and a blue pixel area B emitting blue light. The pixel element PX disposed in each of the pixel areas PA is connected to the gate wiring 110 and the data wiring 140.

The sealing member 300 is disposed in the non-display area NDA of the first display panel 100. Other signal lines, such as a voltage line or the like, may be disposed outside the sealing member 300.

The second display panel 200 may be a panel including a common electrode. The common electrode may be located entirely in the display area DA and non-display area NDA of the second display panel 200.

Hereinafter, the display device 10 will be described in more detail with reference to FIGS. 2 to 4.

Figure 2:
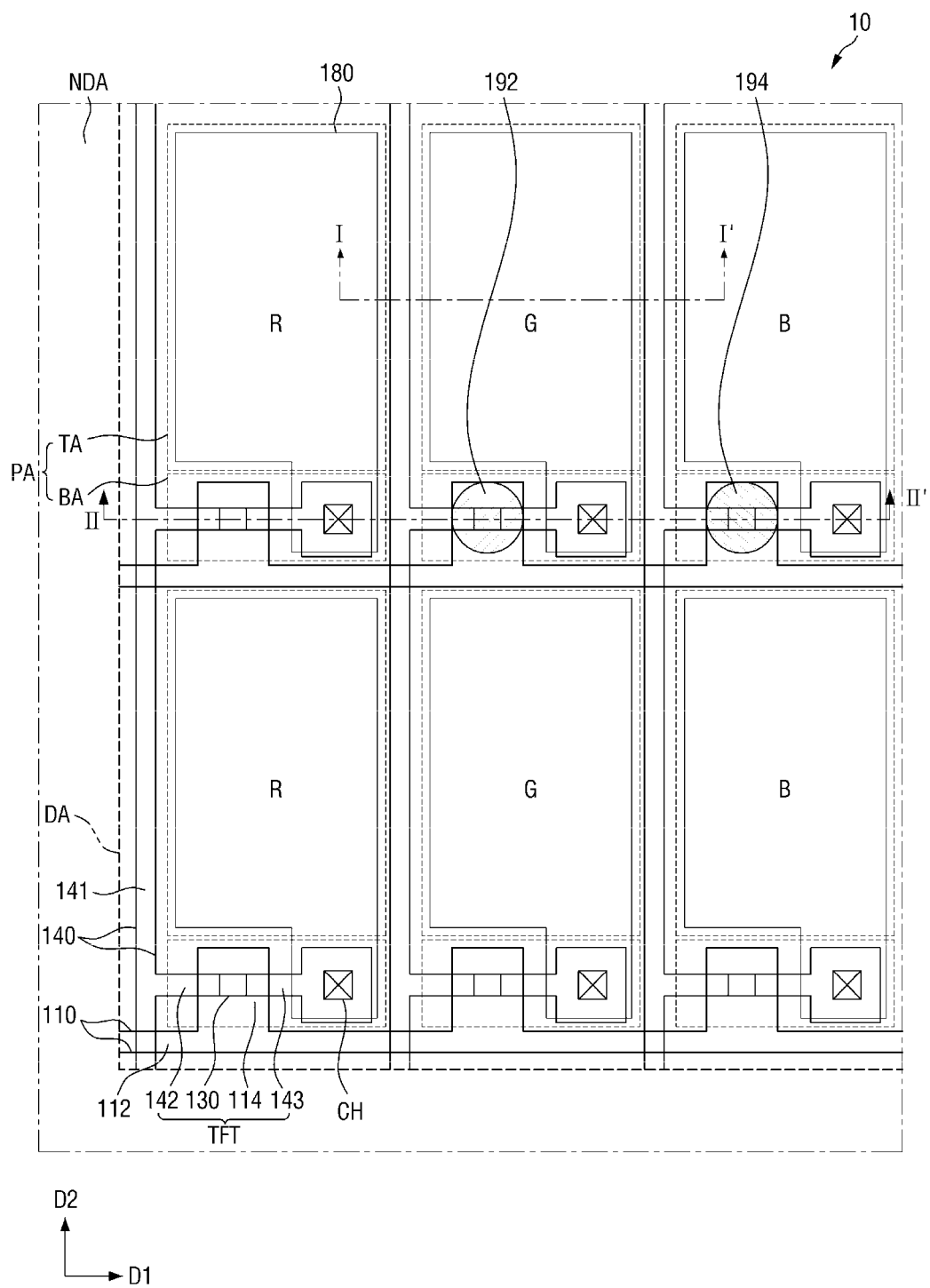
FIG. 2 is an enlarged plan view of the portion A of FIG. 1.
Figure 3:
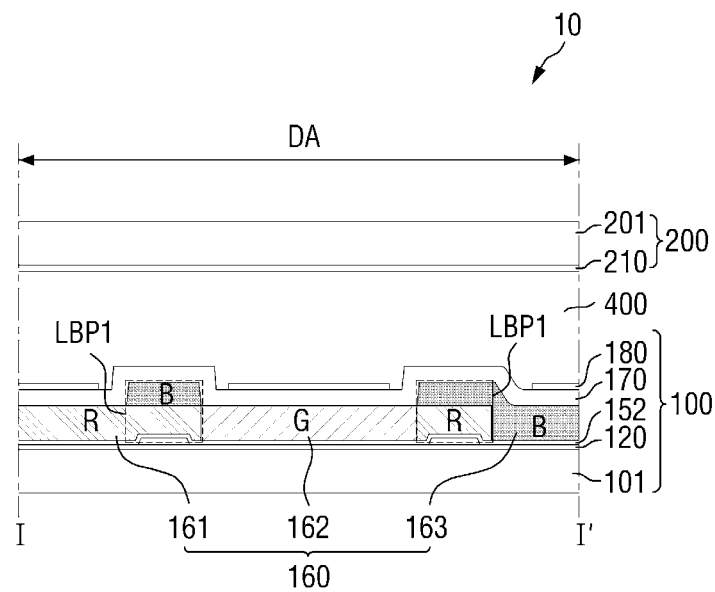
FIG. 3 is a cross-sectional view taken along line I-I' of FIG. 2.
Figure 4:
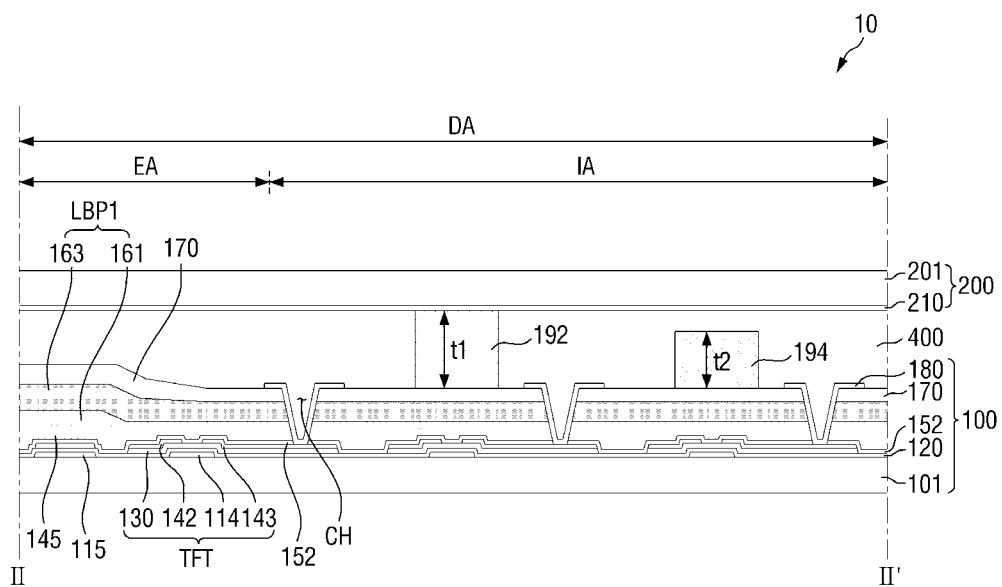
FIG. 4 is a cross-sectional view taken along line II-II' of FIG. 2.

FIG. 2 is an enlarged plan view of the portion A of FIG. 1, FIG. 3 is a cross-sectional view taken along line I-I' of FIG. 2, and FIG. 4 is a cross-sectional view taken along line II-II' of FIG. 2.

Referring to FIGS. 2 to 4, the display device 10, as described above, includes a first display panel 100, a second display panel 200 facing the first display panel 100, a sealing member (300 of FIG. 1) attaching the first display panel 100 and the second display panel 200, and a liquid crystal layer 400 disposed between the first display panel 100 and the second display panel 200.

First, the first display panel 100 may include a first substrate 101, a gate wiring 110, a gate insulation layer 120, a semiconductor layer 130, a data wiring 140, a passivation layer 152, a color filter layer 160, a protective layer 170, a pixel electrode 180 (or a first electrode), a main column spacer 192, and a sub column spacer 194. In addition, the first display panel 100 may include a light blocking pattern LBP1.

The first substrate 101 may include the display area DA and the non-display area NDA, which have been described with reference to FIG. 1. The display area DA may include a plurality of pixel areas PA. The pixel area PA may be an area in which a pixel element PX for driving one pixel is disposed. The pixel area PA may include a light transmitting area TA and a light blocking area BA. A pixel electrode 180 to be described later may be disposed on the light transmitting area TA of the pixel area PA, and switching elements to be described later may be disposed on the light blocking area BA of the pixel area PA. Illustratively, the switching element may be a thin film transistor TFT.

The first substrate 101 may be made of transparent glass, transparent plastic, or the like.

The gate wiring 110 is disposed on the light blocking area BA of the first substrate 101 and transmits a gate signal. The gate wiring 110 includes a gate line 112 extending in the first direction D1 and a gate electrode 114 protruding from the gate line 112 in a direction intersecting the first direction D1. The gate electrode 114 constitutes a thin film transistor TFT together with a semiconductor layer 130, a source electrode 142 and a drain electrode 143, which will be described later.

The gate wiring 110 may be made of aluminum-based metals such as aluminum (Al) and aluminum alloys, silver-based metals such as silver (Ag) and silver alloys, copper-based metals such as copper (Cu) and copper alloys, molybdenum-based metals such as molybdenum (Mo) and molybdenum alloys, chromium (Cr), titanium (Ti), tantalum (Ta), or the like.

Further, the gate wiring 110 may have a multi-film structure including two conductive films having different physical properties from each other. In the multi-film structure, one conductive film may be made of a metal having low electrical resistivity, for example, an aluminum-based metal, a silver-based metal, or a copper-based metal, so as to reduce the signal delay or voltage drop of the gate wiring 110. Unlike this, the other conductive film may be made of another material, particularly, a material having excellent contact properties with indium tin oxide (ITO) and indium zinc oxide (IZO), for example, a molybdenum-based metal, chromium, titanium, or tantalum. Good examples of such combinations may include a chromium lower film and an aluminum upper film, an aluminum lower film and a molybdenum upper film, and a titanium lower film and a copper upper film. However, the structure of the gate wiring 110 is not limited thereto, and the gate wiring 110 may be made of various metals and conductors.

The gate insulation layer 120 may be disposed on the first substrate 101 to cover the gate wiring 110. The gate insulation layer 120 may be disposed not only on the display area DA of the first substrate 101 but also on the non-display area NDA of the first substrate 101. The gate insulation layer 120 may contain silicon oxide ($SiO_x$) or silicon nitride ($SiN_x$). The gate insulation layer 120 may further contain aluminum oxide, titanium oxide, tantalum oxide, or zirconium oxide.

The semiconductor layer 130 is disposed on the gate insulation layer 120 and forms a channel of the thin film transistor TFT. The semiconductor layer 130 may be disposed to at least overlap the gate electrode 114. The semiconductor layer 130 may be made of amorphous silicon, or may be made of an oxide semiconductor containing at least one of gallium (Ga), indium (In), antimony (Sn), and zinc (Zn).

The data wiring 140 may be disposed on the semiconductor layer 130. The data wiring 140 may include a data line 141, a source electrode 142, and a drain electrode 143.

The data line 141 may extend in a second direction D2 intersecting the first direction D1 which is the extending direction of the gate line 112. The source electrode 142 is branched from the data line 141, and extends onto the semiconductor layer 130 overlapping the gate electrode 114. The drain electrode 143 is spaced apart from the source electrode 142, and is disposed on the semiconductor layer 130. A part of the semiconductor layer 139 disposed between the source electrode 142 and the drain electrode 143 may function as the channel region of the thin film transistor TFT. The drain electrode 143 may extend to overlap a part of the pixel electrode 180 on the semiconductor layer 130.

The passivation layer 152 may be disposed on the gate insulation layer 120, the semiconductor layer 130, the source electrode 142, and the drain electrode 143. The passivation layer 152 may be disposed not only on the display area DA of the first substrate 101 but also on the non-display area NDA of the first substrate 101. The passivation layer 152 may contain an inorganic insulation material such as silicon oxide, silicon nitride, or silicon oxynitride. The passivation layer 152 may protect the thin film transistor TFT, and may prevent a material contained in the color filter layer 160 to be described later from permeating into the semiconductor layer 130.

The color filter layer 160 may be disposed on the passivation layer 152. The color filter layer 160 may be disposed to overlap the pixel area PA. In some exemplary embodiments, the color filter layer 160 may not overlap the light blocking area BA, or only a part of the edge of the color filter layer 160 may overlap the light blocking area BA. Further, in some exemplary embodiments, the color filter layer 160 may not overlap a contact hole CH through which the drain electrode 143 of the thin film transistor TFT is connected to the pixel electrode 180. The color filter layer 160 may be made of a photosensitive organic material including a color material, and may be configured to include a red color filter 161, a green color filter 162, and a blue color filter 163, which are disposed in the respective pixel areas PA.

The red color filter 161, the green color filter 162, and the blue color filter 163 may filter light provided from a backlight unit (not shown), and may provide red light, green light and blue light to the respective pixel areas PA.

Light blocking pattern LBP1 having a stacked structure formed by at least two color filters of the red color filter 161, the green color filter 162 and the blue color filter 163 may be disposed in the boundary of the pixel areas PA and the non-display area NDA. Illustratively, the light blocking pattern LBP1 may be disposed to overlap the light blocking area BA, and may be disposed not to overlap the light transmitting area TA. The light blocking pattern LBP1 may cover portions of the thin film transistor TFT, the contact hole CH and the pixel electrode 180 which overlap the light blocking area BA. The light blocking pattern LBP1 may further overlap the gate wiring 110 and the data wiring 140. In some exemplary embodiments, the light blocking pattern LBP1 may be formed in a shape extending along the first direction D1. The light blocking pattern LBP1 may serve to block unnecessary light, and thus a separate black matrix made of a conventionally used black material may be omitted.

Illustratively, the light blocking pattern LBP1 may be formed to have a stacked structure by the red color filter 161 and the blue color filter 163. The light blocking pattern LBP1 having a stacked structure of the red color filter 161 and the blue color filter 163 is formed in a continuous shape from the outermost area of the display area DA to a predetermined area, for example, the gate driving unit 800, while having a relatively large width, without additional patterning, so as to allow a portion of the light blocking pattern LBP1 in the non-display area NDA to be thicker than a portion of the light blocking pattern LBP1 in the inner area IA of the display area DA. In this case, the light blocking pattern LBP1 may be formed such that the thickness of the light blocking pattern LBP1 disposed in the edge area EA of the display area DA increases from the inner area IA of the display area DA to the non-display area NDA. Illustratively, the difference between the thickness of one point of the light blocking pattern LBP1 in the edge area EA and the thickness of one point of the light blocking pattern LBP1 in the inner area IA may be 0.1 μm or more.

The light blocking pattern LBP1 may be formed such that the thickness of at least one of the red color filter 161 and the blue color filter 163 of the light blocking pattern LBP1 disposed in the edge area EA of the display area DA increases from the inner area IA of the display area DA to the non-display area NDA. The reason for this is that, during manufacture of the red color filter 161 and the blue color filter 163, a part of a red color filter material and a part of a blue color filter material flow from the non-display area NDA to the display area DA.

Accordingly, at least one of the red color filter 161 and the blue color filter 163 may have different heights in the edge area EA and inner area IA of the display area DA. For example, the highest point of the blue color filter 163 located in the edge area EA of the display area DA may be different from the highest point of the blue color filter 163 located in the inner area IA of the display area DA.

The protective layer 170 may be disposed on the color filter layer 160 and the light blocking pattern LBP1. The protective layer 170 may be located not only on the display area DA of the first substrate 101 but also on the non-display area NDA of the first substrate 101. In some exemplary embodiments, the protective layer 170 may be made of a photosensitive organic material.

Like the light blocking pattern LBP1, a portion of the protective layer 170 in the non-display area NDA may have a greater thickness than a portion of the protective layer 170 in the inner area IA of the display area DA. Further, the thickness of the protective layer 170 disposed in the edge area EA of the display area DA may increase from the inner area IA of the display area DA to the non-display area NDA.

The pixel electrode 180 may be disposed on the protective layer 170. The pixel electrode 180 may be disposed to overlap the light transmitting area TA of the pixel area PA. A part of the pixel electrode 180 extends to overlap the light blocking area BA, so as to be physically connected to the drain electrode 143 through the contact hole CH.

The pixel electrode 180 may contain a transparent conductive material. For example, the pixel electrode 180 may contain a metal oxide such as indium zinc oxide, indium tin oxide, tin oxide, or zinc oxide.

A plurality of the main column spacers 192 may be disposed throughout the display area DA on the protective layer 170. Illustratively, the main column spacer 192 may be disposed in an area overlapping the thin film transistor TFT at the light blocking area BA. The main column spacer 192 has a first thickness t1, and serves to maintain the cell gap between the first substrate 101 and the second substrate 201. The main column spacer 192 may have a circular shape in a plan view, but is not limited thereto.

A plurality of the sub column spacers 194 may be disposed throughout the display area DA on the protective layer 170. Illustratively, the sub column spacer 194 may be disposed in an area overlapping the thin film transistor TFT at the light blocking area BA. The sub column spacer 194 has a second thickness t2 less than the first thickness t1, and serves to assist the main column spacer 192 by maintaining a cell gap between the first substrate 101 and the second substrate 201 when external pressure is applied to the display device 10. The sub column spacer 194 may have a circular shape in a plan view, but is not limited thereto. The number of the sub column spacers 194 may be equal to or less than the number of the main column spacers 192, both of which may be formed at regular intervals in the display area DA.

The main column spacer 192 and the sub column spacer 194 may be formed of the same material in the same manufacturing step. For example, the main column spacer 192 and the sub column spacer 194 may be formed by patterning an acrylic organic material or a photosensitive organic material. Details of the main column spacer 192 and the sub column spacer 194 will be described later.

An alignment film may be further disposed on the main column spacer 192, the sub column spacer 194, and the pixel electrode 180. Further, a lower polarizer may be disposed on the lower surface of the first substrate 101.

The second display panel 200 may include a second substrate 201 and a common electrode 210 (or a second electrode).

The second substrate 201 may be made of transparent glass, transparent plastic, or the like.

The common electrode 210 may be disposed on a surface of the second substrate 201 facing the first display panel 100. The common electrode 210 may be made of a transparent conductor such as indium tin oxide (ITO) or indium zinc oxide (IZO). In some exemplary embodiments, the common electrode 210 may be formed over substantially the entire surface of the second substrate 201. A common voltage may be applied to the common electrode 210 to form an electric field together with the pixel electrode. An alignment film may be further disposed on the common electrode 210. Further, an upper polarizer may be disposed on the upper surface of the second substrate 201.

The sealing member (300 of FIG. 1) attaches the first display panel 100 and the second display panel 200 together. The sealing member may be located at a portion overlapping the non-display area NDA of the first display panel 100.

The liquid crystal layer 400 may include a plurality of liquid crystal molecules having dielectric anisotropy. When an electric field is applied between the first display panel 100 and the second display panel 200, the liquid crystal molecules rotate in a specific direction between the first display panel 100 and the second display panel 200, thereby transmitting or blocking light.

Hereinafter, the main column spacer 192 and the sub column spacer 194 will be described in detail.

As shown in FIG. 4, the main column spacer 192 is disposed only in the inner area IA of the display area DA, and thus is not located in the edge area EA of the display area DA. The main column spacer 192 may be disposed on the light blocking pattern LBP1 in the inner area IA, but is not be provided on the light blocking pattern LBP1 disposed in the edge area EA.

The reason for this is that, if the main column spacer is disposed in the edge area of the display area DA, the uppermost surface of the main column spacer located in the edge area EA may be higher than the uppermost surface of the main column spacer 192 located in the inner area IA of the display area DA due to the light blocking pattern LBP1 in the edge area EA of the display area DA being thicker than the inner area IA of the display area DA. That is, if the main column spacer is also provided in the edge area EA, the main column spacers may have different heights in the edge area EA and inner area IA of the display area DA. In this case, the cell gap between the first substrate 101 and the second substrate 201 may become non-uniform between the edge area EA and inner area IA of the display area DA, because the pressure applied to the light transmittance material, such as liquid crystals, disposed in the edge area EA of the display area DA may become different than the pressure applied to the liquid crystals disposed in the inner area IA when the first substrate 101 and the second substrate 201 are pressed and attached together. Accordingly, the amount of liquid crystals filled in the edge area EA of the display area DA may be different from that of the inner area EA of the display area DA, and thus an undesirable, edge stain phenomenon in which the edge area EA of the display area DA is seen relatively bright may occur.

The edge area EA of the display area DA is an area having a predetermined width from the outermost side of the display area DA to the inner side of the display area DA, and, as described above, is an area in which the thickness of the light blocking pattern LBP1 increases from the inner area IA of the display area DA to the non-display area NDA. The width (W of FIG. 1) of the edge area EA of the display area DA may be about 0.1 mm to 3 mm.

The sub column spacer 194 is formed together with the main column spacer 192 in the same manufacturing process, and may be disposed in the inner area IA of the display area DA, except for the edge area EA of the display area DA, similarly to the main column spacer 192, in order to facilitate manufacture.

As described above, in the display device 10 according to the illustrated exemplary embodiment, the main column spacer 192 is disposed on the light blocking pattern LBP1 of the inner area IA but is not disposed on the light blocking pattern LBP1 of the edge area EA, which is thicker than the light blocking pattern LBP1 of the inner area IA, so that it is possible to prevent a phenomenon in which the cell gap in the inner area IA and the edge area EA of the display area DA becomes non-uniform due to the different thickness of the light blocking pattern LBP1 and/or the protective layer 170 in the inner area IA and the edge area EA of the display area DA. Accordingly, the liquid crystals may be substantially uniformly filled in the inner area IA and the edge area EA of the display area DA, thereby reducing or preventing the occurrence of an edge stain phenomenon in which the edge area EA of the display area DA is seen relatively bright. Therefore, it is possible to improve display quality.

Figure 5:
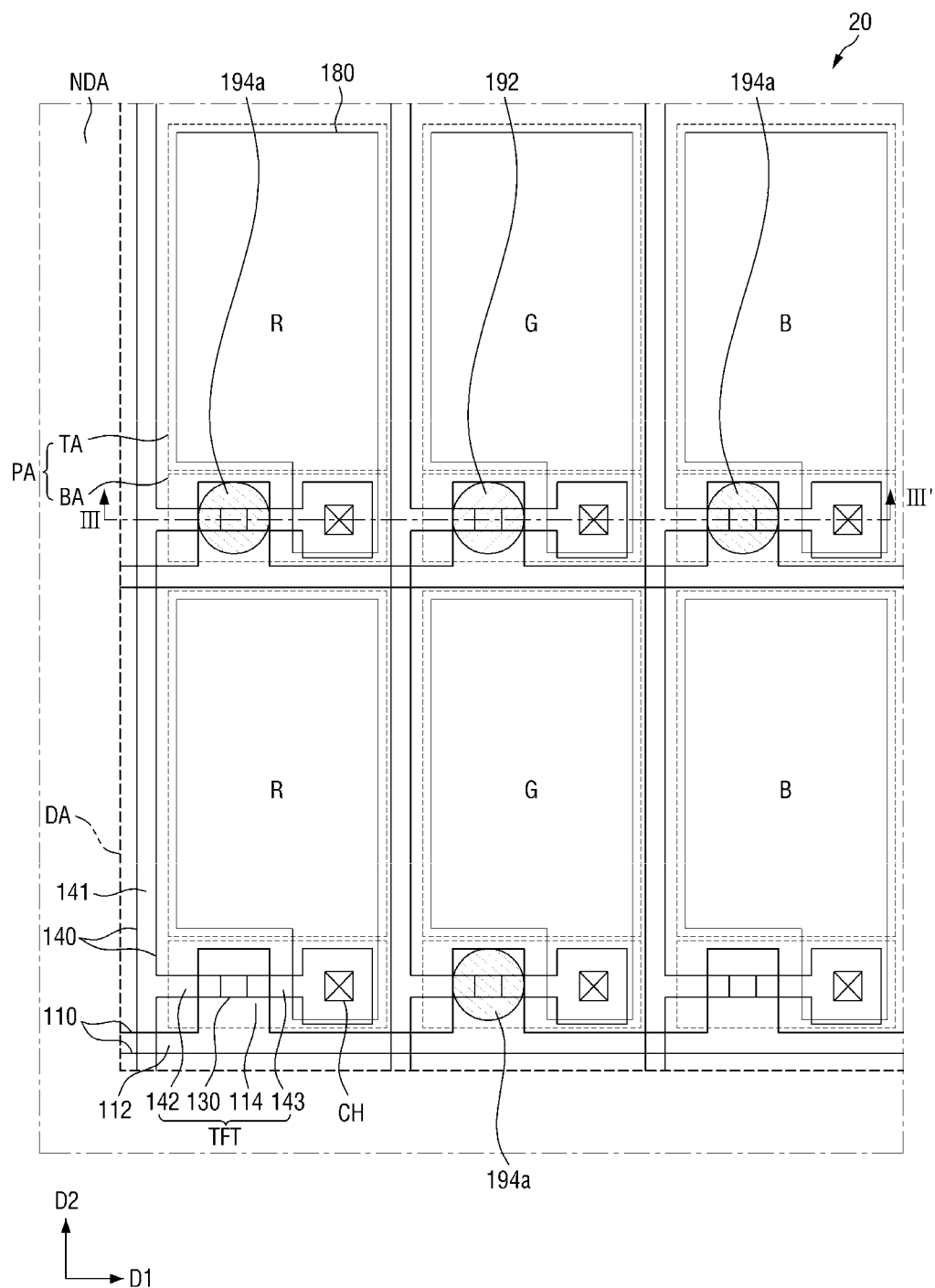
FIG. 5 is an enlarged plan view of a portion of another exemplary embodiment of a display device corresponding to portion A of FIG. 1 constructed according to the principles of the invention.
Figure 6:
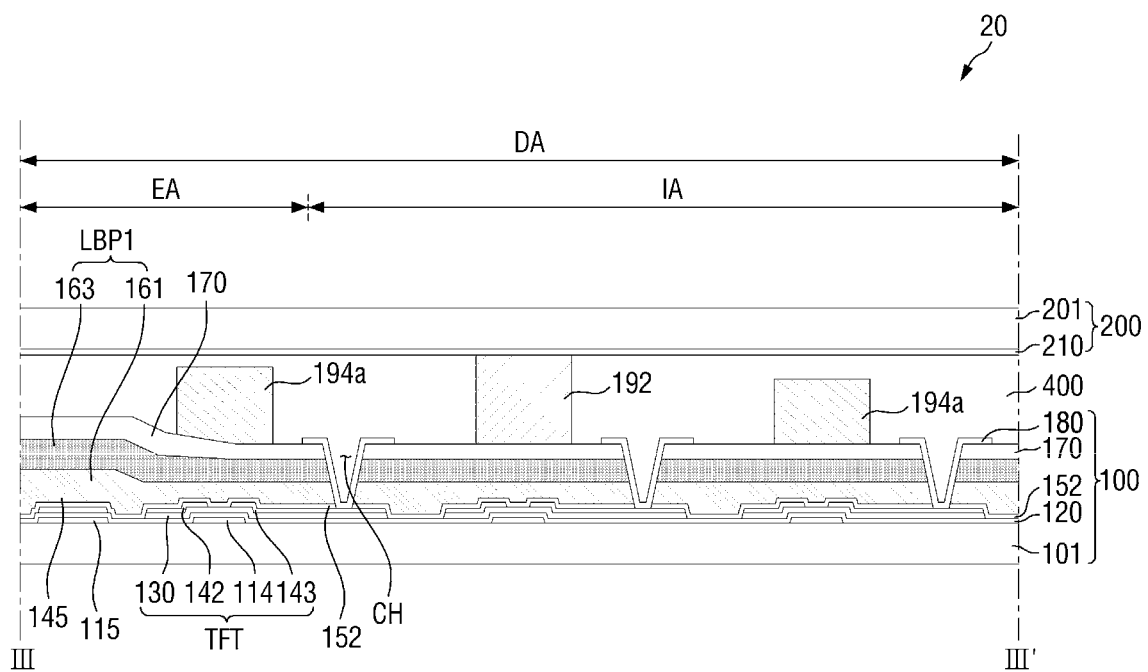
FIG. 6 is a cross-sectional view taken along line III-III' of FIG. 5.
Figure 7:
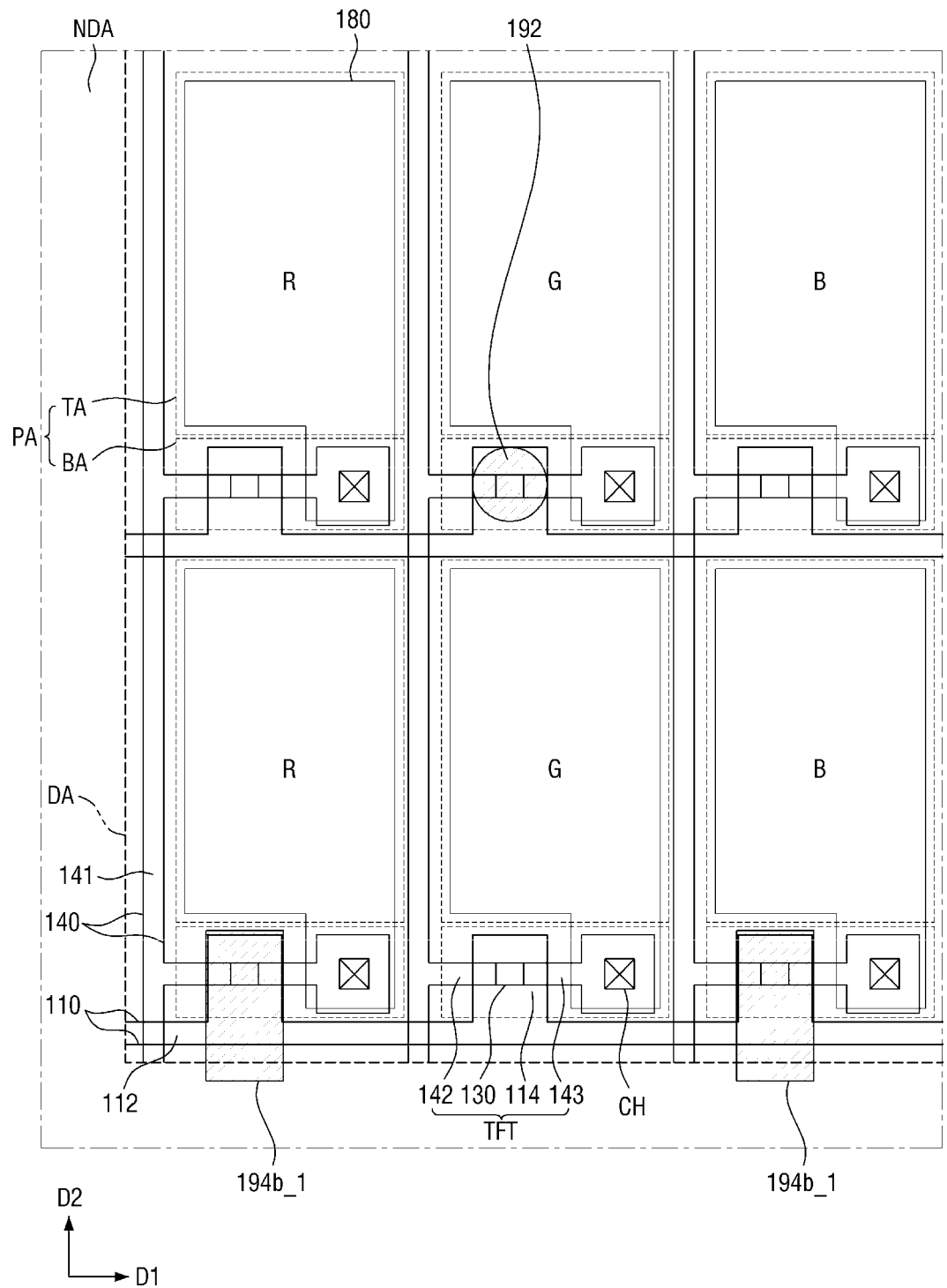
FIGS. 7 and 8 are enlarged plan views of further exemplary embodiments of a display device including modified sub column spacers constructed according to the principles of the invention.
Figure 8:
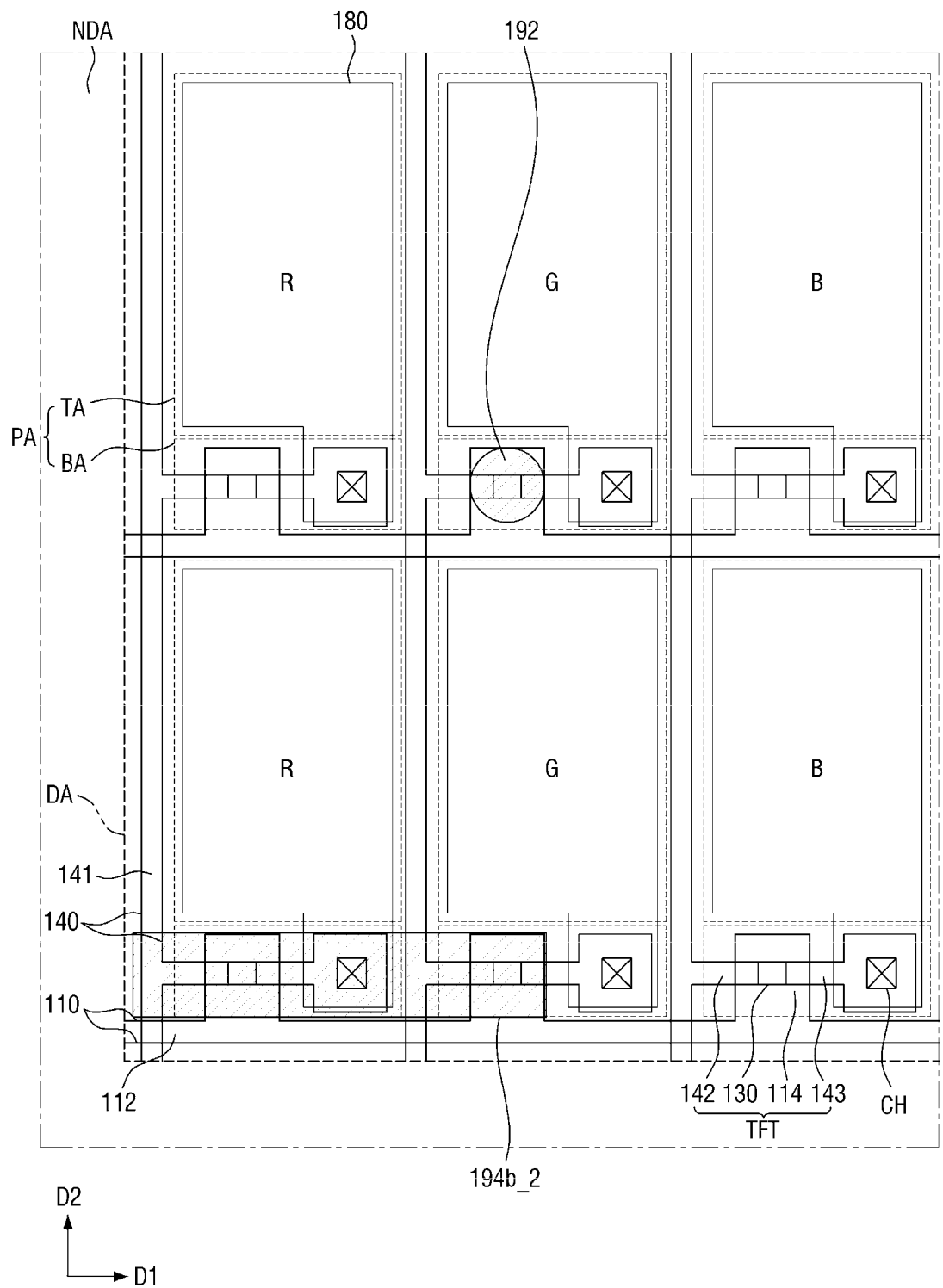

FIG. 5 is an enlarged plan view of a portion of another exemplary embodiment of a display device corresponding to portion A of FIG. 1 constructed according to the principles of the invention, FIG. 6 is a cross-sectional view taken along line III-III' of FIG. 5, and FIGS. 7 and 8 are enlarged plan views of further exemplary embodiments of a display device including modified sub column spacers constructed according to the principles of the invention.

Referring to FIGS. 5 and 6, a display device 20 differs from the display device 10 of FIGS. 1 to 4 in that sub column spacers 194*a* are disposed not only in the inner area IA of the display area DA but also in the edge area EA of the display area DA.

Such a disposition is possible when the difference between the thickness of the main column spacer 192 and the thickness of the sub column spacer 194*a* is 0.3 μm or more. The reason for this is that the uppermost surface of the sub column spacer 194*a* disposed on the light blocking pattern LBP1 having a thick thickness in the edge area EA of the display area DA compared to the inner area IA of the display area DA is lower than the uppermost surface of the main column spacer 192. Here, the uppermost surface of the sub column spacer 194*a* disposed in the edge area EA of the display area DA may be higher than the uppermost surface of the sub column spacer 194*a* disposed in the inner area IA of the display area DA.

Due to the above configuration, the sub column spacer 194*a* disposed in the edge area EA does not protrude upward from the main column spacer 192 disposed in the inner area IA, so that a phenomenon in which the cell gap between the first substrate 101 and the second substrate 201 differs in the edge area EA and in the inner area IA may not occur.

The density of the sub column spacers 194a arranged in the edge area EA may be equal to or lower than the density of the main column spacers 192 arranged only in the inner area IA of the display area DA. This may allow the liquid crystals to substantially uniformly spread to the edge area EA when the first substrate 101 and the second substrate 201 are pressed and attached together, and thus the rate at which the liquid crystals flows and is distributed in the cell gap can be improved. More specifically, the liquid crystals may be substantially uniformly filled in both the edge area EA and inner area IA of the display area DA, so that it is possible to prevent the occurrence of an edge stain phenomenon in which the edge area EA is seen relatively bright by the difference in the dispersion rate of liquid crystals.

FIGS. 5 and 6 illustrate a case where the sub color spacer 194a is disposed within the edge area EA of the display area DA, but, as shown in FIG. 7, at least one sub column spacer 194b_1 may have a shape extending from the edge area EA of the display area DA to the non-display region NDA. It is shown in FIG. 7 that the sub column spacer 194b_1 has a rectangular shape in a plan view, but other shapes are possible. Further, it is shown in FIG. 7 that the sub column spacer 194b_1 having a shape extending from the edge area EA of the display area DA is located at a side (a side in which a circuit board transmitting external signals is mounted) opposite to a side at which the data driving unit 900 in the first display panel 100 of FIG. 1 is located, but other configurations are possible.

Further, as shown in FIG. 8, at least one sub column spacer 194b_2 may be disposed to overlap at least two thin film transistors TFT of the adjacent pixel areas PA. It is shown in FIG. 8 that the sub column spacer 194b_2 has a rectangular shape in a plan view, but other shapes are possible. Further, in some exemplary embodiments, at least one sub column spacer 194b_2 disposed in the outermost pixel area PA located in the edge area EA may be adjacent to the wirings disposed in the non-display area NDA. For example, at least one sub column spacer 194b_2 may be adjacent to the plurality of wirings 115 and 145 of FIG. 6 that is patterned and formed in an area in which the gate driving unit 800 of the first display panel 100 of FIG. 1 is formed.

Figure 9:
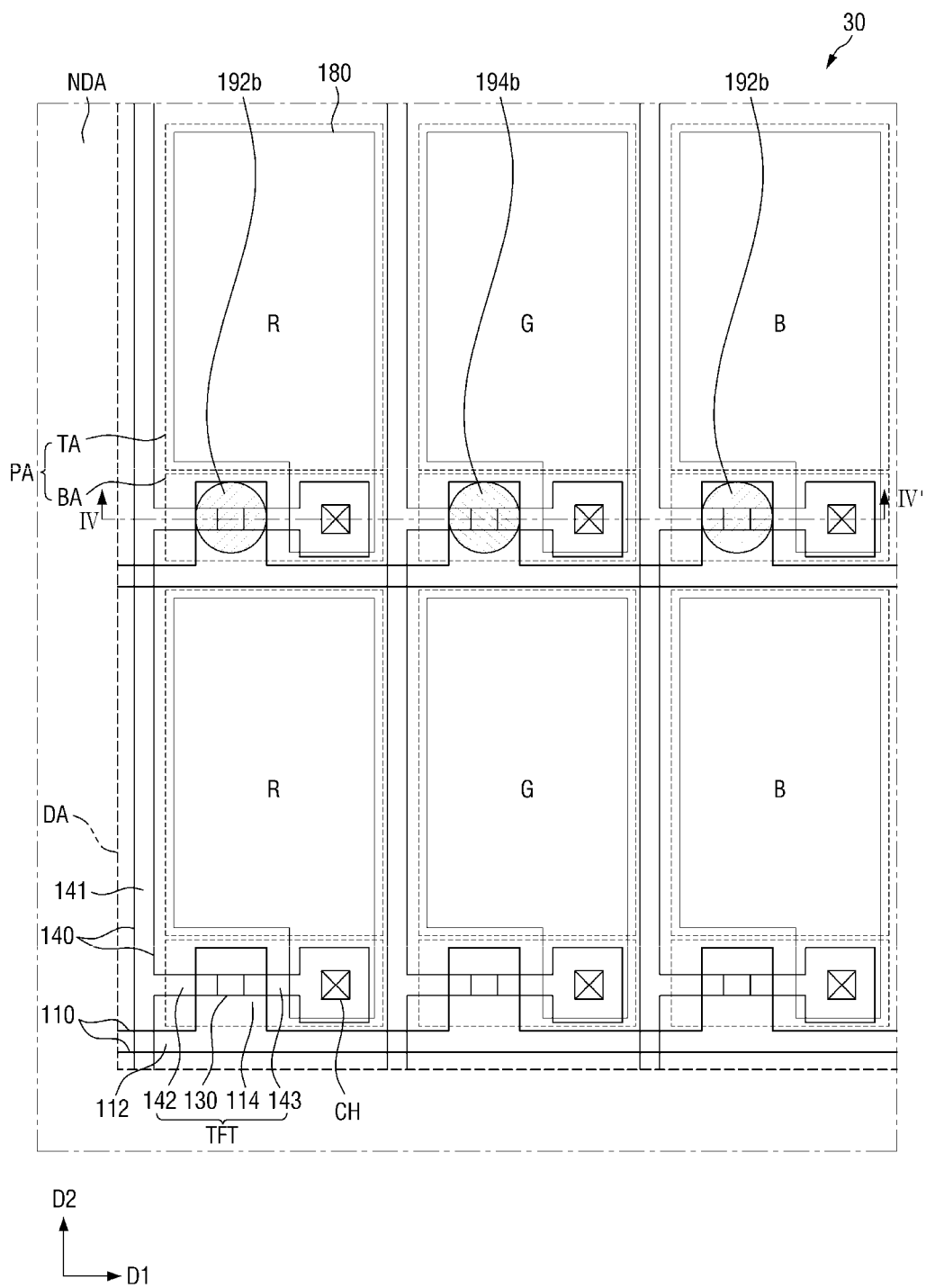
FIG. 9 is an enlarged plan view of a portion of still another exemplary embodiment of a display device corresponding to portion A of FIG. 1 constructed according to the principles of the invention.
Figure 10:
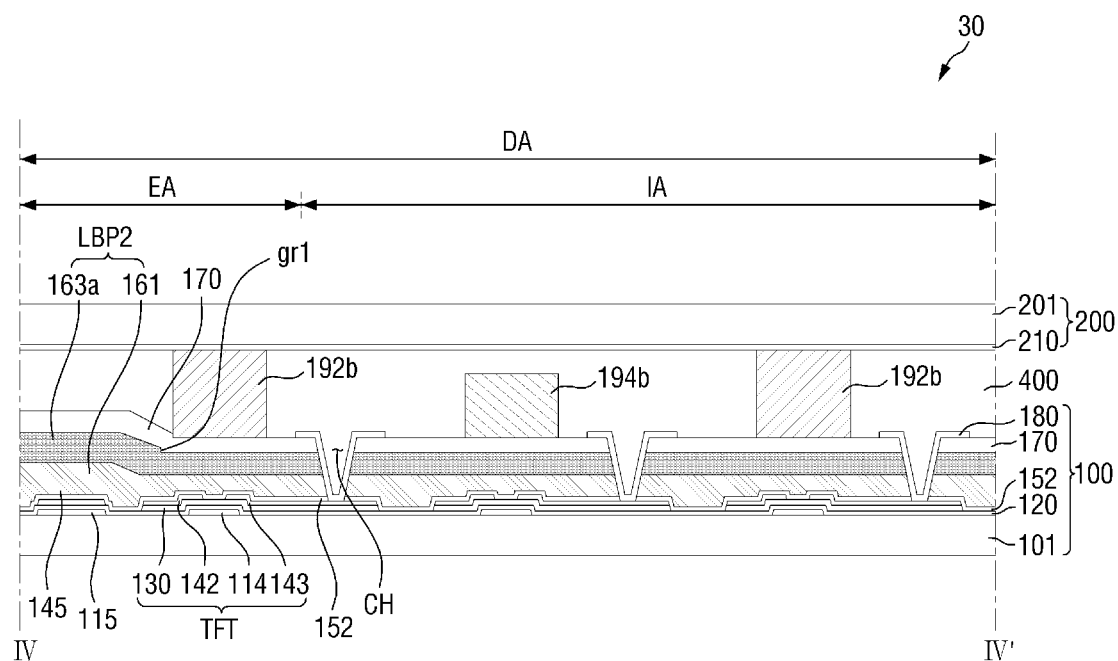
FIG. 10 is a cross-sectional view taken along line IV-IV' of FIG. 9.

FIG. 9 is an enlarged plan view of a portion of still another exemplary embodiment of a display device corresponding to portion A of FIG. 1 constructed according to the principles of the invention, and FIG. 10 is a cross-sectional view taken along line IV-IV' of FIG. 9.

Referring to FIGS. 9 and 10, a display device 30 differs from the display device 10 of FIGS. 1 to 4 in that main column spacers 192b are disposed not only in the inner area IA of the display area DA but also in the edge area EA of the display area DA.

This arrangement is based on an exemplary embodiment in which the blue color filter 163a of the light blocking pattern LBP2 has a groove gr1 in an area overlapping the main column spacer 192b disposed in the edge area EA of the display area DA. The groove gr1 of the blue color filter 163a reduces the thickness of the light blocking pattern LBP2 overlapping the main column spacer 192b disposed in the edge area EA, thereby allowing the uppermost surface of the main column spacer 192b disposed in the edge area EA of the display area DA and the uppermost surface of the main column spacer 192b disposed in the inner area IA of the display area DA to be disposed in substantially the same horizontal plane. The groove gr1 of the blue color filter 163a may be formed by adjusting the exposure amount in the photolithography step for forming the blue color filter 163a.

Due to the above configuration, the cell gap between the first substrate 101 and the second substrate 201 may be substantially uniform in the edge area EA and the inner area IA. Accordingly, the liquid crystals may be substantially uniformly filled in the inner area IA and the edge area EA. Therefore, it is possible to prevent the occurrence of an edge stain phenomenon in which the edge area EA of the display area DA is seen relatively bright.

Figure 11:
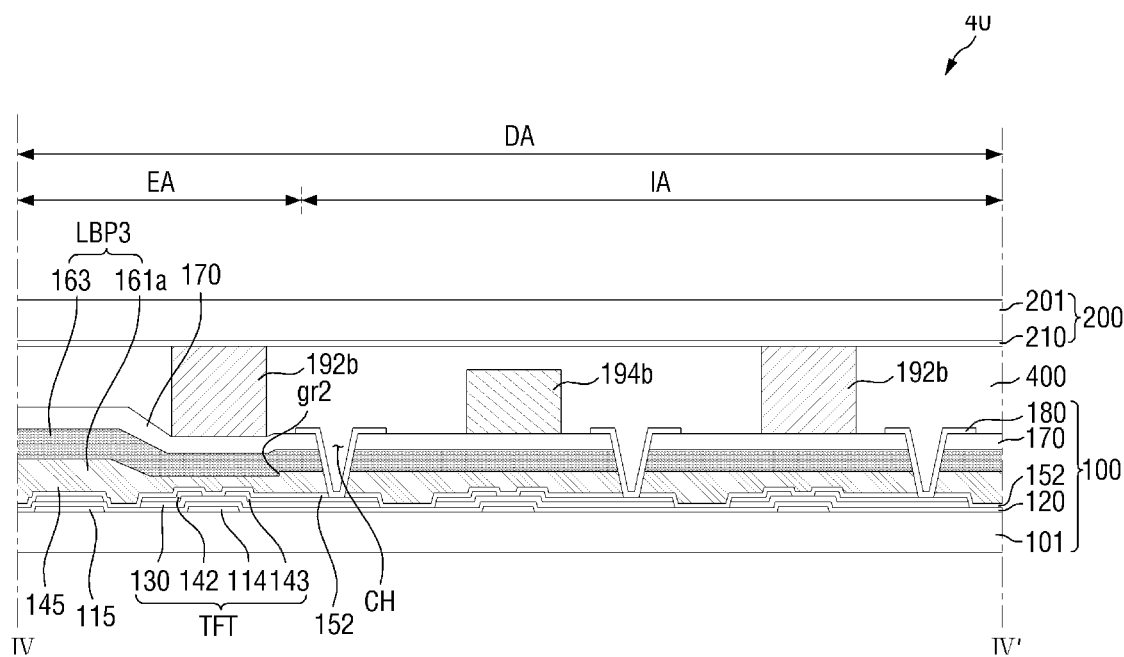
FIG. 11 is a cross-sectional view taken along line IV-IV' of FIG. 9 of a display device constructed according to yet still another exemplary embodiment of the invention.

FIG. 11 is a cross-sectional view taken along line IV-IV' of FIG. 9 of a display device constructed according to yet still another exemplary embodiment of the invention.

Referring to FIG. 11, a display device 40 differs from the display device 30 of FIGS. 9 and 10 in that the red color filter 161a of the light blocking pattern LBP3 has a groove gr2 in an area overlapping the main column spacer 192b disposed in the edge area EA of the display area DA.

The groove gr2 of the red color filter 161a reduces the thickness of the light blocking pattern LBP3 overlapping the main column spacer 192b disposed in the edge area EA, thereby allowing the uppermost surface of the main column spacer 192b disposed in the edge area EA of the display area DA and the uppermost surface of the main column spacer 192b disposed in the inner area IA of the display area DA to be disposed in substantially the same horizontal plane. The groove gr2 of the red color filter 161a may be formed by adjusting the exposure amount in the photolithography step for forming the red color filter 161a.

Due to the above configuration, the cell gap between the first substrate 101 and the second substrate 201 may be substantially uniform in the edge area EA and the inner area IA. Accordingly, the liquid crystals may be substantially uniformly filled in the inner area IA and the edge area EA. Therefore, it is possible to prevent the occurrence of an edge stain phenomenon in which the edge area of the display area is seen relatively bright.

Figure 12:
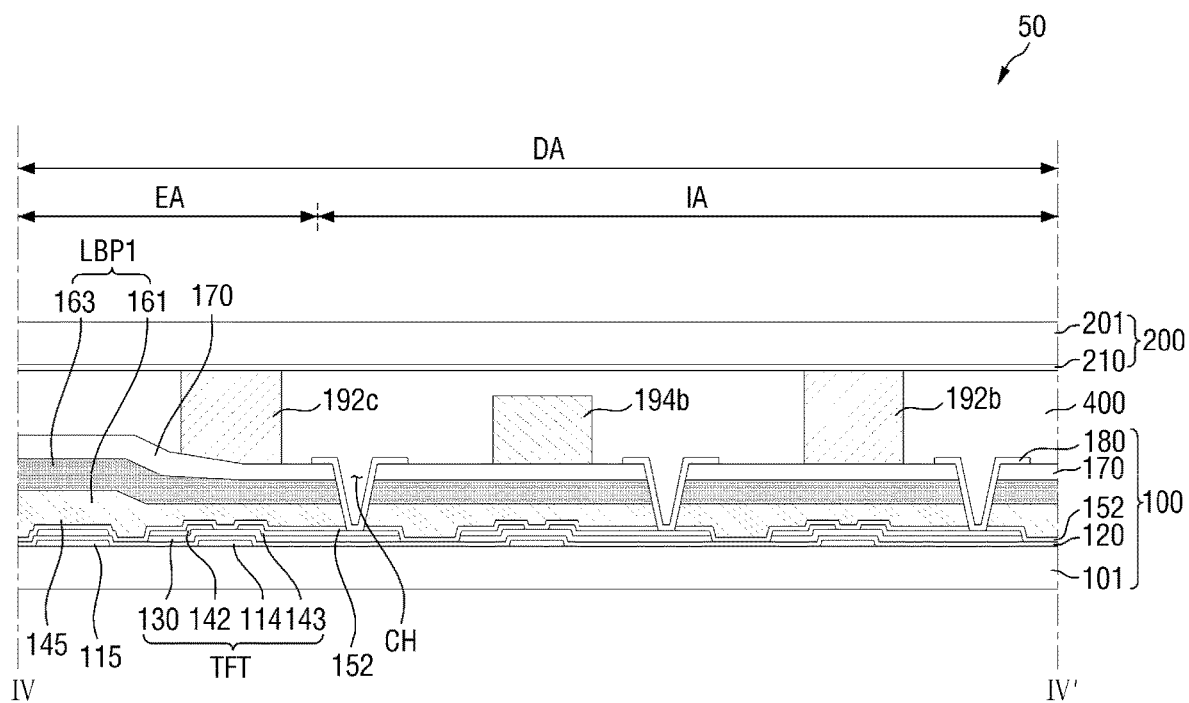
FIG. 12 is a cross-sectional view taken along line IV-IV' of FIG. 9 of a display device constructed according to still another exemplary embodiment of the invention.

FIG. 12 is a cross-sectional view taken along line IV-IV' of FIG. 9 of a display device constructed according to still another exemplary embodiment of the invention.

Referring to FIG. 12, a display device 50 differs from the display device 30 of FIGS. 9 and 10 in that the main column spacer 192c is disposed on the light blocking pattern LBP1 of the edge area EA of the display area DA having a thickness greater than that of the inner area IA of the display area DA.

This arrangement is possible by adjusting the exposure amount in the photolithography step for forming the main column spacer 192c and the main column spacer 192b such that the uppermost surface of the main column spacer 192c disposed in the edge area EA of the display area DA and the uppermost surface of the main column spacer 192b disposed in the inner area IA of the display area DA may be disposed in substantially the same horizontal plane.

Due to the above configuration, the cell gap between the first substrate 101 and the second substrate 201 may be substantially uniform in the edge area EA and the inner area IA. Accordingly, the liquid crystals may be substantially uniformly filled in the inner area IA and the edge area EA. Therefore, it is possible to reduce or prevent the occurrence of an edge stain phenomenon in which the edge area of the display area is seen relatively bright.

Some of the advantages that may be achieved by exemplary embodiments of the invention include improving display quality of a display device by reducing or preventing the edge stain phenomenon in liquid crystal or similar display devices.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device, comprising:
a first substrate including a display area having a plurality of pixel areas and a non-display area surrounding at least part of the display area, the display area including an interior area and at least one edge area disposed exteriorly of the interior area;
thin film transistors disposed in the pixel areas of the first substrate;
a color filter layer including color filters disposed in the pixel areas on the thin film transistors;
a light blocking pattern disposed in a boundary between the pixel areas and the non-display area, the light blocking pattern having a stacked structure including at least two of the color filters;
a second substrate defining with the first substrate a light transmittance space to contain light transmittance material;
pixel electrodes disposed in the pixel areas and electrically connected with the thin film transistors; and
a plurality of first spacers disposed in the light transmittance space between the first and second substrates and only in the interior area of the display area,
wherein a thickness of the light blocking pattern disposed in the edge area increases from the display area to the non-display area.

2. The display device of claim 1, wherein the edge area is disposed along a boundary of the display area and the non-display area, and has a width of about 0.1 mm to about 3 mm.

3. The display device of claim 1, wherein at least some of the first spacers overlap the thin film transistors, and
wherein the plurality of first spacers maintains substantially uniform spacing between the first and second substrates across the interior area.

4. The display device of claim 1, further comprising:
a plurality of second spacers disposed in the edge area and the interior area and having a height less than the height of the first spacers,
wherein at least some of the plurality of second spacers overlap the thin film transistors.

5. The display device of claim 4, wherein:
the first spacers comprise main column spacers and the second spacers comprise sub column spacers, the main column spacers have a height that differs from the height of the sub column spacers by 0.3 µm or more, and
the sub column spacers are arranged at a density equal to or lower than that of the main column spacers.

6. The display device of claim 4, wherein at least one of the second spacers disposed in the edge area has a shape extending to the non-display area.

7. The display device of claim 4, wherein an uppermost surface of one of the second spacers disposed in the edge area is disposed in a position higher than an uppermost surface of another one of the second spacers disposed in the inner area, and lower than uppermost surfaces of the first spacers.

8. The display device of claim 4, wherein the at least some of the second spacers are disposed to overlap two adjacent thin film transistors.

9. The display device of claim 4, wherein at least one of the second spacers disposed in outermost pixel areas located in the edge area is adjacent to wirings disposed in the non-display area.

10. The display device of claim 1, further comprising a protective layer disposed on the color filter layer and the light blocking pattern, and
wherein the first spacers are disposed on the protective layer, and the stacked structure of the color filters comprises a red color filter and a blue color filter.

11. A display device, comprising:
a first substrate including a display area having a plurality of pixel areas and a non-display area at least partially surrounding the display area;
thin film transistors disposed in the pixel areas of the first substrate;
a color filter layer including color filters disposed in the pixel areas on the thin film transistors;
a light blocking pattern disposed in a boundary of the pixel areas and the non-display area and having a stacked structure of at least two of the color filters;
pixel electrodes disposed in the pixel areas and electrically connected with the thin film transistors; and
a plurality of first spacers disposed in an edge area of the display area adjacent to the non-display area and in an inner area of the display area,
wherein an uppermost surface of one of the first spacers disposed in the edge area and an uppermost surface of another of the first spacers disposed in the inner area are located in substantially the same plane, and
wherein a thickness of the light blocking pattern disposed in the edge area increases from the display area to the non-display area.

12. The display device of claim 11, wherein the edge area is disposed along a boundary of the display area and the non-display area, and has a width of about 0.1 mm to about 3 mm.

13. The display device of claim 11, further comprising a protective layer disposed on the color filter layer and the light blocking pattern, and wherein the first spacers are disposed on the protective layer, and the stacked structure of color filters comprises a stacked structure of a red color filter and a blue color filter.

14. The display device of claim 13, wherein one of the blue color filter and the red filter has a groove disposed in an area overlapping the first spacer disposed in the edge area.

15. The display device of claim 11, wherein at least some of the plurality of first spacers overlap the thin film transistors.

16. A display device, comprising:
a first substrate including a display area having a plurality of pixel areas and a non-display area at least partially surrounding the display area;
thin film transistors disposed in the pixel areas of the first substrate;
a color filter layer including color filters disposed in the pixel areas on the thin film transistors;
a light blocking pattern disposed in a boundary of the pixel areas and the non-display area and having a stacked structure of at least two of the color filters;
pixel electrodes disposed in the pixel areas and electrically connected with the thin film transistors;
a plurality of first spacers disposed in an edge area of the display area adjacent to the non-display area and in an inner area of the display area;
a plurality of second spacers disposed in the edge area and the inner area, wherein an uppermost surface of one of the first spacers disposed in the edge area and an uppermost surface of another of the first spacers disposed in the inner area are located in substantially the same plane, and the first spacers comprise main column spacers and the second spacers comprise sub column spacers.

17. The display device of claim 16, wherein:

the plurality of second spacers have a thickness less than the first spacers, and at least some of the plurality of second spacers overlap the thin film transistors.

18. The display device of claim 16, wherein a difference between the height of the main column spacers and the height of the sub column spacers is about 0.3 μm or more.

* * * * *